(12) United States Patent
Cukur et al.

(10) Patent No.: US 8,040,135 B1
(45) Date of Patent: Oct. 18, 2011

(54) CONTRAST AND RESOLUTION ENHANCEMENT WITH SIGNAL COMPENSATION

(75) Inventors: Tolga Cukur, Foster City, CA (US); Michael Lustig, Berkeley, CA (US)

(73) Assignee: The Board of Trustees of the Leland Stanford Junior University, Palo Alto, CA (US)

( * ) Notice: Subject to any disclaimer, the term of this patent is extended or adjusted under 35 U.S.C. 154(b) by 0 days.

(21) Appl. No.: 12/789,315

(22) Filed: May 27, 2010

(51) Int. Cl.
G01V 3/00 (2006.01)
(52) U.S. Cl. ........................................ 324/309; 324/307
(58) Field of Classification Search .......... 324/300–322; 600/407–445
See application file for complete search history.

(56) References Cited

U.S. PATENT DOCUMENTS

| | | | | |
|---|---|---|---|---|
| 6,154,030 | A * | 11/2000 | Wurl | 324/322 |
| 6,452,387 | B1 * | 9/2002 | Hargreaves et al. | 324/300 |
| 7,286,871 | B2 * | 10/2007 | Cohen | 600/544 |
| 7,292,039 | B1 * | 11/2007 | Laub et al. | 324/318 |
| 7,468,605 | B2 * | 12/2008 | Yu et al. | 324/309 |
| 7,518,364 | B1 * | 4/2009 | Cukur | 324/309 |
| 7,567,081 | B2 * | 7/2009 | Bieri et al. | 324/309 |
| 7,576,535 | B2 * | 8/2009 | Hargreaves | 324/307 |
| 7,647,177 | B2 * | 1/2010 | Schmidt et al. | 701/300 |
| 2004/0239323 | A1 * | 12/2004 | Taylor et al. | 324/307 |
| 2009/0256563 | A1 * | 10/2009 | Lee et al. | 324/309 |
| 2010/0060277 | A1 * | 3/2010 | Nezafat et al. | 324/309 |
| 2010/0292568 | A1 * | 11/2010 | Droitcour et al. | 600/425 |

OTHER PUBLICATIONS

Heidemann, R.M., O. Ozsarlak, P.M. Parizel, J. Michiels, B. Kiefer, V. Jellus, M. Muller, F. Breuer, M. Blaimer, M.A. Griswold, and P.M. Jakob, "A Brief Review of Parallel Magnetic Resonance Imaging," *Eur Radiol* 13 (2003): 2323-2337.

Brittain, J.H., E.W. Olcott , A. Szuba , G.E. Gold, G.A. Wright, P. Irarrazaval, and D.G. Nishimura, "Three-Dimensional Flow-Independent Peripheral Angiography," *Magn Reson Med* 38 (1997): 343-354.

Bangerter, N. K., B.A. Hargreaves, J.H.B.B. Hu, S.S. Vasanawala, and D.G. Nishimura, "3D Fluid-Suppressed T2-Prep Flow-Independent Angiography using Balanced SSFP," *Proceedings of the 12th Annual Meeting of ISMRM*, Kyoto, (2004): p. 11.

Çukur, T, J.H. Lee, N. K. Bangerter, B.A. Hargreaves, and D.G. Nishimura, "Non-Contrast-Enhanced Flow-Independent Peripheral MR Angiography with Balanced SSFP," *Magn Reson Med* 61 (2009): 1533-1539.

Lustig, M., D. Donoho, and J.M. Pauly, "Sparse MRI: The Application of Compressed Sensing for Rapid MR Imaging," *Magn Reson Med* 58 (2007): 1182-1195.

Leupold, J., J. Hennig, and K. Scheffler, "Alternating Repetition Time Balanced Steady State Free Precession," *Magn Reson Med* 55 (2006): 557-565.

Nezafat, R., R. Ouwerkerk, A.J. Derbyshire, M. Stuber, and E.R. McVeigh, "Spectrally Selective B1-Insensitive T2 Magnetization Preparation Sequence," *Magn Reson Med* 61 (2009): 1326-1335.

(Continued)

*Primary Examiner* — Brij Shrivastav
(74) *Attorney, Agent, or Firm* — Beyer Law Group LLP

(57) ABSTRACT

A method for enhancing resolution and contrast in an MRI image is provided. A transient signal acquisition is applied to acquire a plurality of samples of data, comprising reducing transient signal oscillations and acquiring a plurality of MRI samples of data. Transient signal compensation is applied to the plurality of samples of data to provide data with signal compensation. A noise reduction technique is applied to the data with signal compensation. Data resulting from the applying the noise reduction is used to generate an MRI image.

19 Claims, 6 Drawing Sheets

OTHER PUBLICATIONS

Korin, H.W., S.J. Riederer, A.E.H. Bampton, and R.L. Ehman, "Altered Phase Encoding Order for Reduced Sensitivity to Motion Corruption in Three-Dimensional MR Imaging," *J Magn Reson Imaging* 2 (1992):687-693.

Le Roux, P., "Simplified Model and Stabilization of SSFP Sequences," *J Magn Reson* 163 (2003):23-37.

Pipe, J.G., "Reconstructing MR Images from Undersampled Data: Data-Weighting Considerations," *Magn Reson Med* 43 (2000):867-875.

Mugler, J.P., F.H. Epstein, and J.R. Brookeman, "Shaping the Signal Response During the Approach to Steady State in Three-Dimensional Magnetization-Prepared Rapid Gradient-Echo Imaging Using Variable Flip Angles," *Magn Reson Med* 28 (1992): 165-185.

Li, X., E.T. Han, R.F. Busse, and S. Majumdar, "In Vivo $T_{1rho}$ Mapping in Cartilage Using 3D Magnetization-Prepared Angle-Modulated Partitioned k-Space Spoiled Gradient Echo Snapshots (3D MAPSS)," *Magn Reson Med* 59 (2008): 298-307.

Zhao, L., R. Mulkern, C.H. Tseng, D. Williamson, S. Patz, R. Kraft, R.L. Walsworth, F.A. Jolesz, and M.S. Albert, "Gradient-Echo Imaging Considerations for Hyperpolarized Xe MR," *J Magn Reson* B 113 (1996): 179-183.

Shenberg, I., and A. Macovski, "Resolution and Noise Considerations in MRI Systems with Time-varying Gradients," *IEEE Trans Med Imaging* 4 (1985): 144-152.

Oshio, K., and M. Singh, "A Computer Simulation of T2 Decay Effects in Echo Planar Imaging," *Magn Reson Med* 11 (1989): 389-397.

Zhou, X., Z.P. Liang, G.P. Cofer, C.F. Beaulieu, S.A. Suddarth, and G.A. Johnson, "Reduction of Ringing and Blurring Artifacts in Fast Spin-Echo Imaging," *J Magn Reson Imaging* 3 (1993): 803-807.

Pruessmann, K.P., "Encoding and Reconstruction in Parallel MRI," *NMR Biomed* 19 (2006): 288-299.

Buades, A., B. Coll, and J.M. Morel, "A Review of Image Denoising Algorithms, with a New One," *Multisc Model Simulat* 4 (2005): 490-530.

R. F. Busse, "Designing Variable Flip Angle Refocusing Trains to Optimize Resolution, Signal-to-Noise, and RF Power," *Proc. Intl. Soc. Mag. Reson. Med.* 13 (2005): 2349.

* cited by examiner

CONTRAST AND RESOLUTION ENHANCEMENT WITH SIGNAL COMPENSATION

GOVERNMENT RIGHTS

This invention was made with Government support under contract HL075803 awarded by the National Institutes of Health and under contract HL39297 awarded by the National Institutes of Health. The Government has certain rights in this invention.

BACKGROUND OF THE INVENTION

This invention relates generally to magnetic resonance imaging (MRI).

Magnetic resonance imaging (MRI) is a non-destructive method for the analysis of materials, and provides medical imaging. It is generally non-invasive and does not involve ionizing radiation. In very general terms, nuclear magnetic moments are excited at specific spin precession frequencies which are proportional to the local magnetic field. The radio-frequency signals resulting from the precession of these spins are received using pickup coils. By manipulating the magnetic fields, an array of signals is provided representing different regions of the volume. These are combined to produce a volumetric image of the nuclear spin density of the body.

MRI is based on nuclear spins, which can be viewed as vectors in a three-dimensional space. During an MRI process, each nuclear spin responds to four different effects: precession about the main magnetic field, nutation about an axis perpendicular to the main field, and both transverse and longitudinal relaxation. In steady-state MRI processes, a combination of these effects occurs periodically.

Gradient echo (GRE) sequences provide significantly improved acquisition speed, and have found wide use in numerous magnetic resonance imaging (MRI) applications such as cardiac imaging, angiography, and 3D volume imaging. However, because data are acquired while the magnetization is in a dynamic equilibrium known as steady-state, GRE demonstrates different signal characteristics than spin-echo sequences. Manipulating the flip angle of radio-frequency (RF) excitations to induce $T_1$- or $T_2$-weighting generally results in poor signal-to-noise ratio (SNR). Furthermore, the short repetition times (TR) of GRE sequences are not suitable for direct application of conventional contrast-generation methods (e.g., inversion recovery, $T_2$-preparation) every TR.

Patents that are in the field of the invention are U.S. Pat. No. 5,122,747 by Riederer et al., issued Jun. 16, 1992, entitled "Spiral Three-Dimensional Fourier Transform NMR Scan," U.S. Pat. No. 5,245,282 by Mugler et al., issued Sep. 14, 1993, entitled "Three-Dimensional Magnetic Resonance Imaging," U.S. Pat. No. 5,912,557 by Wilman et al., issued Jun. 15, 1999, entitled "Centric Phase Encoding Order for 3D NMR Data Acquisition," US H1,968 by Bernstein, published Jun. 5, 2001, entitled "Hyperpolarized MR Imaging Using Pulse Sequence with Progressively Increasing Flip Angle," U.S. Pat. No. 6,885,193 by Foxall, issued Apr. 26, 2005, entitled "Magnetization Primer Sequence for Balanced Steady State Free Precision Imaging," U.S. Pat. No. 7,646,924 by Donoho, issued Jan. 12, 2010, entitled "Method and Apparatus for Compressed Sensing," U.S. Pat. No. 7,164,268 by Mugler et al., issued Jan. 16, 2007, entitled "Method and Apparatus for Spin-Echo-Train MR Imaging Using Prescribed Signal Evolutions," and US Patent Publication No. 2008/0319301 by Busse, published Dec. 25, 2008, entitled "Method and Apparatus for Generating a Flip Angle Schedule for a Spin Echo Train Pulse Sequence," all of which are incorporated by reference for all purposes.

SUMMARY OF THE INVENTION

In accordance with the invention, a method for enhancing resolution and contrast in an MRI image is provided. A transient signal acquisition is applied to acquire a plurality of samples of data, comprising reducing transient signal oscillations and acquiring a plurality of MRI samples of data. Transient signal compensation is applied to the plurality of samples of data to provide data with signal compensation. A noise reduction technique is applied to the data with signal compensation. Data resulting from the applying the noise reduction is used to generate an MRI image.

In another manifestation of the invention, a method for enhancing resolution and contrast in an MRI image is provided. A transient signal acquisition is applied, comprising applying a $T_2$ preparation, applying a ramp catalyzation and performing an alternating repetition time (ATR) steady-state free procession (SSFP) acquisition to acquire a plurality of samples of data. Decay compensation is applied to the plurality of samples of data to provide data with signal compensation. An iterative optimization algorithm is applied to data with decay compensation, wherein the iterative optimization algorithm solves the optimization problem $$\text{minimize} \|m\|_1 + \lambda \text{TV}(m)$$

$$\text{s.t.} \|F_u m - y\|_2 < \epsilon.$$

Data resulting from the iterative optimization algorithm is used to generate an MRI image.

In another manifestation of the invention, an apparatus for providing magnetic resonance imaging is provided. A magnetic resonance imaging excitation and detection system is provided. A controller is electrically connected to the magnetic resonance imaging excitation and detection system, where the controller comprises a display, at least one processor, and computer readable media. The computer readable media comprises computer readable code for applying a transient signal acquisition to acquire a plurality of samples of data, comprising computer readable code for reducing transient signal oscillations and computer readable code for acquiring a plurality of MRI samples of data, computer readable code for applying transient signal compensation to the plurality of samples of data to provide data with signal compensation, computer readable code for applying a noise reduction technique to the data with signal compensation, computer readable code using data resulting from the compressed sensing to generate an MRI image, and computer readable code for displaying the MRI image.

The invention and objects and features thereof will be more readily apparent from the following detailed description and appended claims when taken with the drawings.

Figure 1:
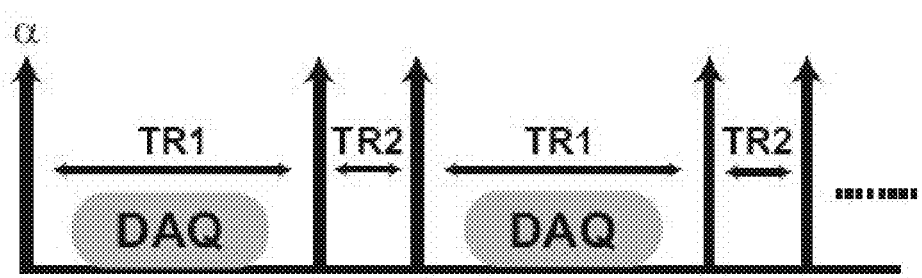
FIG. 1 is a RF pulse diagram for an example of an ATR SSFP sequence where data acquisition is performed during longer TR1 intervals.

FIG.'s 9A and 9B illustrate a computer system that may be used in an embodiment of the invention.

DETAILED DESCRIPTION OF ILLUSTRATED EMBODIMENTS

Magnetization-prepared MR acquisitions offer a trade-off between image contrast and scan efficiency. Although the contrast can be improved by preparing the magnetization more frequently, this significantly increases the scan time. A common solution is to order the collection of data points, such that the samples retaining most of the information in MR images are acquired first. Unfortunately, this leads to loss of spatial resolution and thereby image blurring. The invention provides a novel strategy that processes magnetization-prepared data to prevent any resolution loss, and improve the image contrast without reducing the scan efficiency.

The proposed technique can also be coupled with compressed-sensing reconstructions to further improve the image quality by reducing noise and artifacts. In a particular embodiment of the technique, magnetization-prepared imaging can be performed with steady-state free precession sequences. This embodiment is successfully demonstrated for non-contrast-enhanced MR angiography of the lower extremities, which significantly benefits from sparsity-enforcing compressed-sensing reconstructions. Meanwhile, it is important to note that the proposed strategy is applicable to magnetization-prepared acquisitions in general, and can potentially improve applications such as $T_2$-weighted, $T_{1\rho}$, and hyperpolarized imaging.

To maintain both the desired contrast and the acquisition speed, magnetization-preparation modules are usually coupled with GRE host sequences that capture the initially prepared contrast, followed by a signal-recovery period. Unfortunately, because the prepared contrast gradually decays to the lower steady-state contrast in such transient acquisitions, only a limited amount of k-space data can be collected with the desired contrast following a single preparation.

Magnetization-prepared sequences often employ two complementary strategies to address this issue. First, segmented k-space acquisitions can be performed, where the preparation is repeated multiple times for complete coverage. Increasing the number of segments enhances the image contrast, but degrades the scan efficiency due to the overhead associated with magnetization preparation. Although prolonged scan times can be avoided with the help of acceleration techniques such as parallel imaging and compressed sensing, large undersampling factors that reduce the SNR might be required.

Second, centric phase-encode ordering can be utilized to enhance the captured signal for each shot, since the energy in MR images is mostly concentrated at low spatial frequencies. This strategy reduces the image resolution because the transient decay of the signal results in low-pass filtering of the k-space data. Although variable-flip-angle schemes can improve the signal homogeneity across k-space, this is achieved only at the expense of reducing the overall signal level.

This embodiment of the invention provides a novel method that enhances the contrast and resolution of magnetization-prepared sequences using segmented, centric k-space acquisitions. This embodiment compensates the k-space data for the transient signal decay experienced by a desired tissue of interest. This prevents image blurring in centric acquisitions without reducing the signal levels, thereby improving the spatial resolution. Furthermore, assuming the background tissues have lower spatial-frequency content than the tissue of interest (e.g., muscle vs. blood vessels), the compensation will also increase the tissue signal while the background level remains relatively constant. As a result, the image contrast will be enhanced without the need for prolonged scan times or large undersampling factors.

A particularly suitable application for demonstrating this technique is non-contrast-enhanced flow-independent steady-state free precession (SSFP) angiography. Magnetization-prepared SSFP acquisitions can be employed to produce vessel images without the need for potentially harmful contrast agents. However, the preparation needs to be frequently repeated to effectively capture the transient contrast, and the centric acquisitions can suffer from image blurring. Compensating for the blood signal decay successfully addresses both problems without prolonging the scan times. It is important to note that the overweighting of high-frequency k-space data results in increased noise. Nevertheless, because angiographic datasets are inherently sparse in the image domain, compressed sensing reconstructions can be used to effectively reduce the resulting noise and recover the signal from blood vessels.

Embodiments of the invention can potentially enhance the performance of any application where the prepared contrast is gradually replaced by a steady-state contrast, (e.g., $T_2$-weighted, $T_{1\rho}$, and hyperpolarized imaging).

Example

Magnetization-prepared SSFP methods can produce flow-independent angiograms without contrast agents through segmented, centric k-space acquisitions. Such methods are described in Brittain, J. H., E. W. Olcott, A. Szuba, G. E. Gold, G. A. Wright, P. Irarrazaval, and D. G. Nishimura, "Three-Dimensional Flow-Independent Peripheral Angiography," *Magn Reson Med* 38 (1997): 343-354; Bangerter, N. K., B. A. Hargreaves, J. H. B. B. Hu, S. S. Vasanawala, and D. G. Nishimura, "3D Fluid-Suppressed T2-Prep Flow-Independent Angiography using Balanced SSFP," *Proceedings of the 12th Annual Meeting of ISMRM*, Kyoto, (2004): p. 11; and çukur, T, J. H. Lee, N. K. Bangerter, B. A. Hargreaves, and D. G. Nishimura, "Non-Contrast-Enhanced Flow-Independent Peripheral MR Angiography with Balanced SSFP," *Magn Reson Med* 61 (2009): 1533-1539, which are incorporated by reference for all purposes. However, because the prepared contrast gradually decays to the lower SSFP contrast, signal levels vary across k-space. More frequent preparation can improve the captured contrast by shortening the readout clusters, but it also prolongs the scan time. This embodiment uses a novel method to enhance the contrast and resolution without any scan-time penalties by simply compensating for the signal decay in transient acquisitions. The vessels in sparse angiograms are then recovered with compressed sensing (CS) reconstructions. CS reconstruction is described in Lustig, M., D. Donoho, and J. M. Pauly, "Sparse MRI: The Application of Compressed Sensing for Rapid MR Imaging," *Magn Reson Med* 58 (2007): 1182-1195, which is incorporated by reference for all purposes.

A brief overview of the magnetization-prepared pulse sequence and description of the signal-compensation scheme in conjunction with CS reconstructions is provided as follows:

Pulse Sequence Overview

The major background tissues in the extremities are fat and muscle. Due to its higher $T_2/T_1$ ratio, fat yields a brighter signal than blood. Furthermore, water and fat signals can have opposing phases, which leads to partial volume artifacts. These problems can be addressed by using alternating repetition time (ATR) SSFP to suppress the fat signal in the extremities. An example of such an ATR SSFP process is described in Leupold, J., J. Hennig, and K. Scheffler, "Alternating Repetition Time Balanced Steady State Free Precession," *Magn Reson Med* 55 (2006): 557-565, which is incorporated by reference for all purposes. This technique employs two consecutive repetition times (TR1 and TR2) with potentially different durations and an appropriate phase cycling to create a broad stop-band around the fat resonance. Data acquisition is usually performed during the longer of the two intervals. FIG. 1 is a RF pulse diagram for an example of an ATR SSFP sequence where data acquisition is performed during longer TR1 intervals. In this example, all RF excitations have the same tip angle α. However, the RF phases vary depending on the relative durations of TR1 and TR2.

Figure 2:
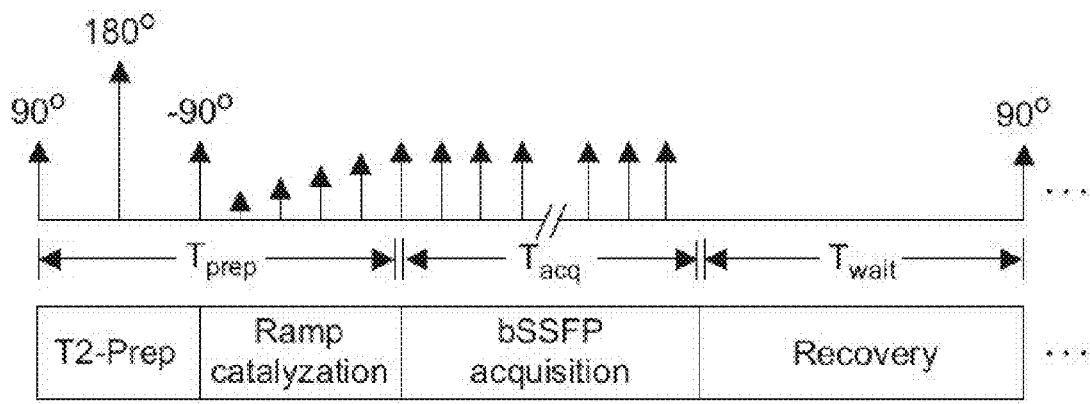
FIG. 2 is a pulse sequence diagram used in an embodiment of the invention.

While the ATR SSFP host sequence achieves reliable fat suppression, $T_2$-preparation with an adiabatic BIR-4 pulse is employed to reduce the muscle signal. An example of an adiabatic BIR-4 pulse is disclosed in Nezafat, R., R. Ouwerkerk, A. J. Derbyshire, M. Stuber, and E. R. McVeigh, "Spectrally Selective B1-Insensitive T2 Magnetization Preparation Sequence," *Magn Reson Med* 61 (2009): 1326-1335, which is incorporated by reference for all purposes. However, because the generated contrast is transient, only a limited number of samples can be acquired following a single preparation. To enhance the capturing efficiency, centric square-spiral phase-encode ordering is used along with a ramped series of RF excitations to dampen the transient signal oscillations. A centric square-spiral phase-encoded ordering is disclosed in Korin, H. W., S. J. Riederer, A. E. H. Bampton, and R. L. Ehman, "Altered Phase Encoding Order For Reduced Sensitivity to Motion Corruption in 3DFT MR Imaging," *J Magn Reson Imaging* 2 (1992): 687-693, which is incorporated by reference for all purposes. A ramped series of RF excitations to dampen the transient signal oscillations is disclosed in Le Roux, P., "Simplified Model and Stabilization of SSFP Sequences," *J Magn Reson* 163 (2003): 23-37, which is incorporated by reference for all purposes. Afterward, data within a single segment are acquired with the host sequence, and the magnetization is allowed to recover. The magnetization preparation is repeated prior to the collection of each k-space segment. The entire pulse sequence diagram is shown in FIG. 2, which is a pulse sequence diagram of the magnetization-prepared SSFP sequence. At the beginning of each k-space segment, a $T_2$-preparation is performed, followed by a ramped series of RF excitations to dampen the transient signal oscillations. Afterward, data is collected with an ATR SSFP host sequence. Because the prepared contrast gradually decays to the steady-state contrast, only a limited number of samples are collected after a single preparation. The magnetization is then allowed to recover during a period $T_{wait}$. This procedure is repeated until all segments are acquired.

Transient Signal Compensation

Figure 3:
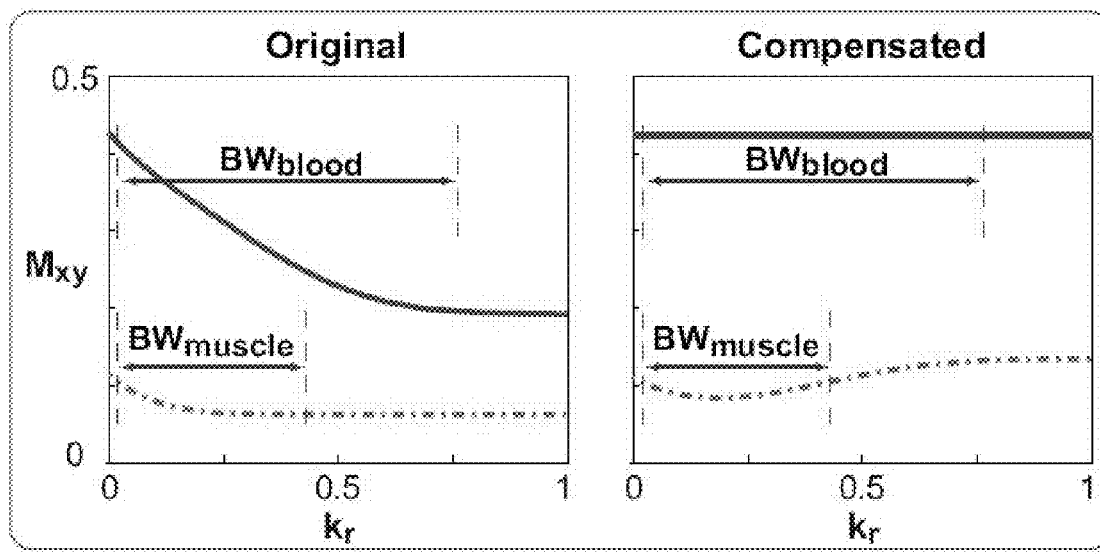
FIG. 3 displays the on-resonant transient signal for blood and muscle as a function of k-space radius ($k_r$), right after $T_2$-preparation.

FIG. 3 displays the on-resonant transient signal for blood and muscle as a function of k-space radius ($k_r$), right after $T_2$-preparation with the aforementioned sequence. The simulation was performed with the following parameters: α=60°, TR1/TR2/TE=3.45/1.15/1.725 ms, 80 ms $T_2$-preparation time, 8 k-space segments, and a 10-excitation catalyzation sequence assuming $T_1/T_2$=1200/250 ms for blood, and $T_1/T_2$=870/47 ms for muscle. These sequence parameters were chosen to maximize the initial blood/muscle contrast while maintaining a relatively low specific absorption rate. In FIG. 3 blood ($T_1/T_2$=1200/250 ms) and muscle (870/47 ms) signals after $T_2$-preparation are shown as a function of k-space radius ($k_r$). The initial blood/muscle contrast of ≈5 decays to ≈3 in steady-state.

FIG. 3 also shows through illustrative spatial-frequency extents (BW) that vessels contribute more heavily to high-spatial-frequency data (e.g., $k_r$>5) than muscle. Therefore, the blood signal can be increased by compensating for its decay in k-space, while the muscle signal remains relatively constant. This enhances the blood/muscle contrast and prevents image blurring. Approximate $T_1$ and $T_2$ values obtained from literature can be used to calculate the compensation function in k-space. While $T_{1,2}$ measurement routines can be incorporated, the exact values of these parameters do not have a significant effect on the final results according to our observations.

The signal compensation has two major effects on the quality of the angiograms. First, because the blood signal is increased relative to the muscle, the overall blood/background contrast is improved. Furthermore, correcting for the blood-signal decay prevents potential loss of spatial resolution in transient acquisitions. Meanwhile, the compensation weights the high spatial frequencies more heavily, and results in increased image noise.

Although the noise is amplified due to overweighting of high spatial frequencies following signal compensation, the sparsity of angiograms allows us to recover the blood signal with compressed sensing. This non-linear reconstruction can be achieved by solving the following optimization problem, $$\text{minimize} \|m\|_1 + \lambda TV(m)$$

$$\text{s.t.} \|F_u m - y\|_2 \leq \epsilon.$$

The objective minimizes the $l^1$-norm of the reconstructed image, m, and the $l^1$ norm of the spatial finite differences of the image (also known as Total Variation, or simply TV), as discussed in Lustig, M., D. Donoho, and J.M. Pauly, "Sparse MRI: The Application of Compressed Sensing for Rapid MR Imaging," *Magn Reson Med* 58 (2007): 1182-1195, which is incorporated by reference for all purposes. The constraint ensures data consistency by forcing the $l^2$-norm difference of the reconstructed k-space, $F_u m$, with the acquired k-space, y, to be below the noise floor, $\epsilon$. The operator $F_u$ indicates a partial Fourier operator. λ is the regularization parameter. TV(m) means that TV operates on the image $\|m\|_1$ denotes the $l^1$-norm of the image m. In this embodiment an iterative nonlinear conjugate-gradient algorithm is used to solve the optimization. In addition to recovering the image, the CS reconstruction denoises the image while preserving the edges, improving the overall SNR.

Results

Non-contrast-enhanced flow-independent angiograms of the lower leg were produced on a 1.5 T GE Signa EX scanner using a quadrature transmit/receive extremity coil. Both fully-sampled and under-sampled acquisitions were performed with the following scan parameters: 19.2×12.8×12.8-cm³ field-of-view, 1×1×1-mm³ resolution, α=60°, 4.6-ms total TR, 125 kHz bandwidth, and 80-ms $T_2$-preparation. Fully-sampled data with number of segments (N)=(4,8,16) and scan times of $T_{scan}$=(88,104,137) sec were reconstructed, along with under-sampled data with factors of R=(1,2,4), N=(4,16,22), and $T_{scan}$=88 sec each.

Figure 4:
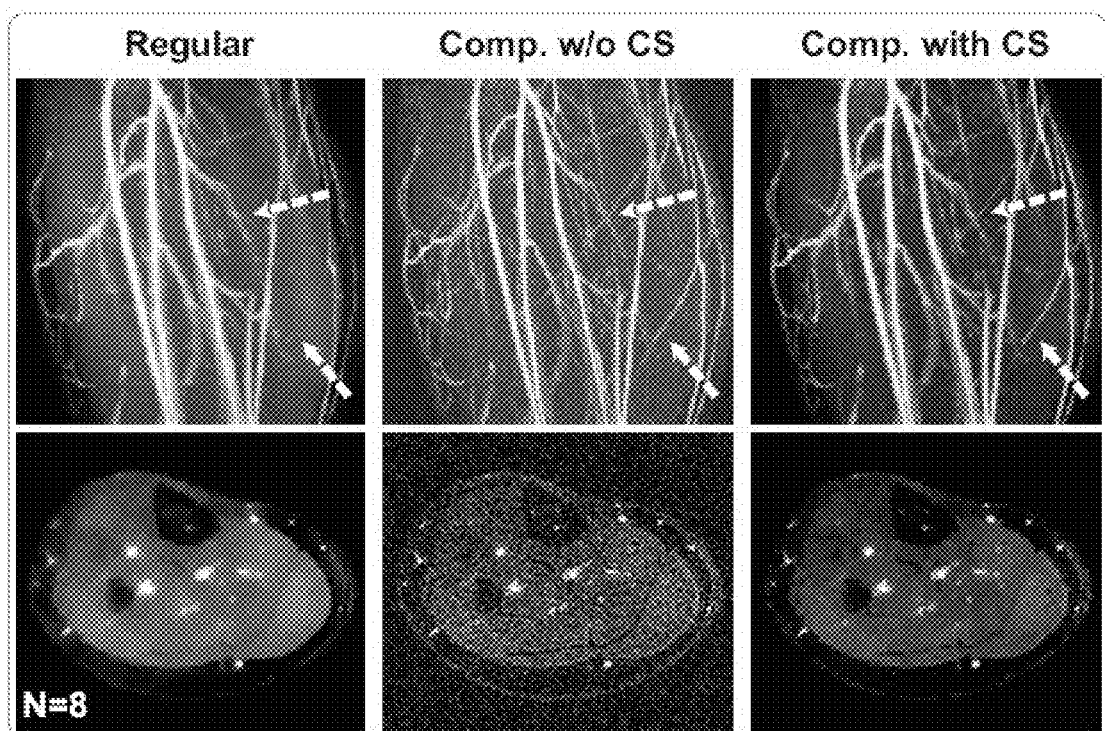
FIG. 4 shows maximum-intensity projections (MIPs) and axial images of regular, compensated without CS and compensated with CS reconstructions, from fully-sampled (N=8) data.

FIG. 4 shows maximum-intensity projections (MIPs) and axial images of regular, compensated without CS, and compensated with CS reconstructions, from fully-sampled (N=8) data. The compensated images with CS are sharper and have superior background suppression.

Figure 5:
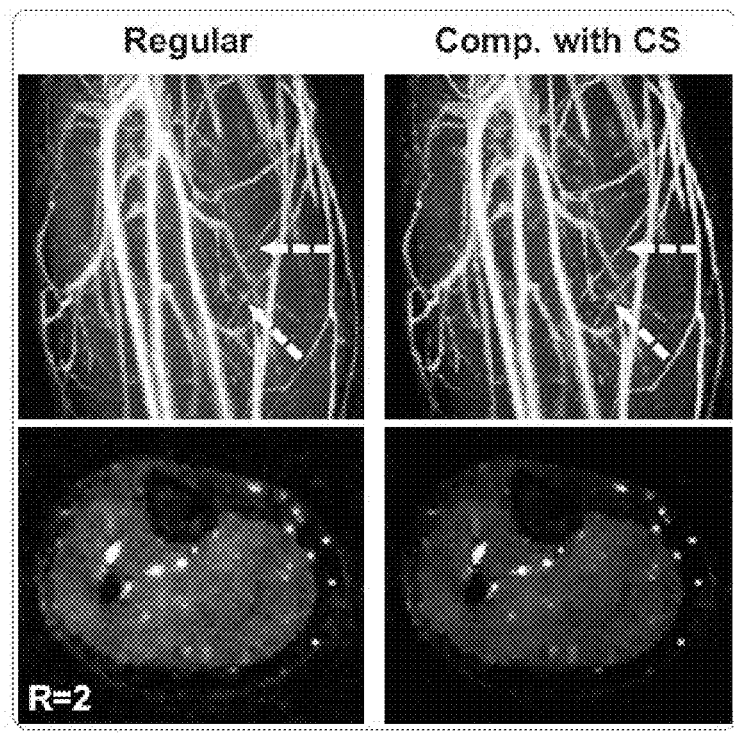
FIG. 5 shows MIPs and axial images of regular and compensated CS reconstructions, from under-sampled (R=2) data. The compensated images are sharper and have superior background suppression as expected.

FIG. 5 shows MIPs and axial images of regular and compensated CS reconstructions, from under-sampled (R=2) data. The compensated images are sharper and have superior background suppression as expected.

As shown in FIG.'s 4 and 5, the proposed strategy improves the contrast and resolution in both the fully- and under-sampled cases, enhancing the depiction of the vasculature. The signal-compensated angiograms without the CS reconstruction, shown in FIG.'s 4 and 5 suffer from increased noise levels as expected. In contrast, the application of the CS reconstruction reduces the image noise and recovers the underlying blood signal reliably.

To quantify the level of resolution improvement achieved by this embodiment of the invention, a measure of spatial resolution was employed based on the point spread function (PSF, i.e., the reconstructed image for an impulse object) as outlined in Pipe, J. G., "Reconstructing MR Images from Undersampled Data: Data-Weighting Considerations," *Magn Reson Med* 43 (2000): 867-875, which is incorporated by reference for all purposes. For various numbers of k-space segments (N), the variation of the blood signal was simulated as a function of k-space radius for both the regular and compensated cases as shown in FIG. 3. These blood signals were separately sampled on a 128×128 grid in the phase-encode plane (ky-kz), yielding an isotropic resolution of 1 mm. The corresponding PSFs were then simulated by computing the inverse Fourier transform of the sampled signals. Finally, the resolution was computed as the ratio of the total area under the PSF to the peak amplitude of the PSF.

Figure 6:
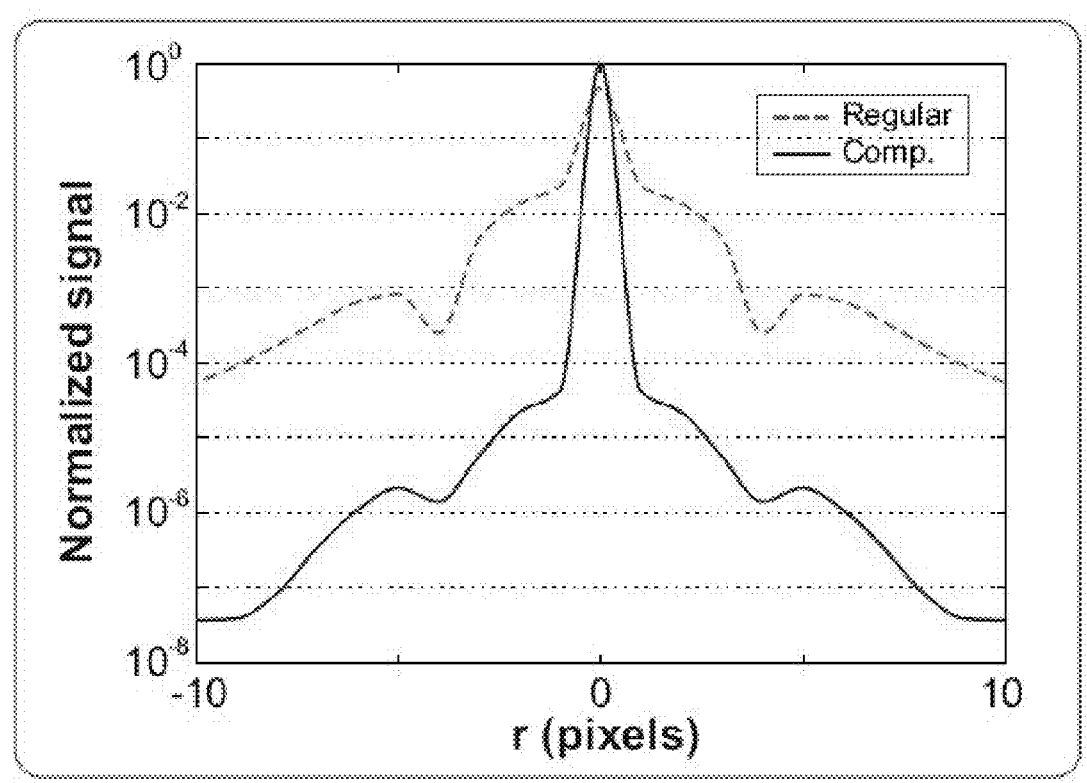
FIG. 6 is a graph of the central cross sections of the point spread functions (PSF) plotted in logarithmic scale for regular and compensated acquisitions.

FIG. 6 is a graph of the central cross sections of the point spread functions (PSF) plotted in logarithmic scale for regular and compensated acquisitions, where the tissue of interest is assumed to be blood ($T_1/T_2$=1200/250 ms). The regular PSF is widened and has a reduced peak amplitude, due to the transient signal decay. On the other hand, the compensation significantly improves the signal homogeneity across k-space, and successfully maintains the target image resolution. Thus, FIG. 6 clearly demonstrates that the regular PSF is widened due to the transient signal decay, and its peak amplitude is reduced. Meanwhile, the compensated PSF has a much narrower mainlobe as expected. Table 1 lists the estimated isotropic spatial resolution (in mm) in the phase-encode plane for regular acquisitions and compensated images. In the regular images, the largest loss in resolution occurs with the smallest number of k-space segments (N). Whereas the image resolution in regular acquisitions is lowered to ≈1.4 mm, in all cases, compensating for the signal decay prevents image blurring and maintains the target image resolution of 1 mm.

TABLE 1

|  | N = 4 | N = 8 | N = 16 |
|---|---|---|---|
| Regular | 1.46 | 1.43 | 1.39 |
| Compensated | 0.99 | 0.99 | 0.99 |

To quantify the level of contrast improvement achieved by this embodiment of the invention, the mean signal levels were measured in identical regions of the source images. The blood signal was measured in the anterior/posterior tibial and peroneal arteries. Meanwhile, neighboring regions of homogeneous signal were selected to measure the muscle signal. Table 2 lists the measured improvements in blood/muscle contrast in regular and compensated (with CS) source images. The largest improvement with compensation is for smaller number of k-space segments (N) and under-sampling factors (R). An embodiment of the invention achieves significantly improved contrast (up to 48%) in all datasets. Furthermore, this embodiment of the invention achieves enhanced resolution and contrast with shorter scan times and lower accelerations compared to regular acquisitions. For example, the compensated contrast for N=4 is higher than the regular contrast for N=16, although N=16 requires a 56%-longer total scan time.

TABLE 2

| Fully-sampled | N = 4 | N = 8 | N = 16 |
|---|---|---|---|
| Regular | 2.68 | 3.30 | 3.55 |
| Compensated | 3.96 | 4.08 | 4.50 |
| % improvement | 47.8% | 37.0% | 26.9% |
| Under-sampled | R = 1 | R = 2 | R = 4 |
| Regular | 2.68 | 3.39 | 3.96 |
| Compensated | 3.96 | 4.60 | 4.70 |
| % improvement | 47.8% | 35.9% | 18.9% |

These embodiments enhance the resolution and contrast of magnetization-prepared acquisitions, by flattening the k-space signal for a given tissue of interest. Afterward, the image noise is reduced with the help of CS, and the underlying tissue signal is more reliably depicted. These embodiments substantially improve the visualization of the vasculature in non-contrast-enhanced peripheral SSFP angiograms.

In other embodiments, any application where the initially prepared contrast is gradually replaced with a lower steady-state contrast can benefit from the invention, such as $T_2$-weighted imaging, $T_{1\rho}$ imaging, and hyperpolarized $C^{13}$ imaging.

Other embodiments may use additional ways to provide improved performance for magnetization-prepared acquisitions. First of all, the image contrast can be enhanced by preparing the magnetization more frequently. However, the scan efficiency is significantly degraded. In addition, when high-energy preparatory RF pulses are employed (e.g., $T_{1\rho}$ imaging), frequent preparation results in increased specific absorption rates (SAR) and limits the applicability at higher field strengths.

Meanwhile, the spatial resolution can be improved with variable-flip-angle schemes that yield a more homogeneous signal across k-space and prevent image blurring. Variable-flip-angle schemes are described in Mugler, J. P., F. H. Epstein, and J. R. Brookeman, "Shaping the Signal Response During the Approach to Steady State in Three-Dimensional Magnetization-Prepared Rapid Gradient-Echo Imaging Using Variable Flip Angles," *Magn Reson Med* 28 (1992):

165-185; Li, X., E. T. Han, R. F. Busse, and S. Majumdar, "In Vivo $T_{1rho}$ Mapping in Cartilage Using 3D Magnetization-Prepared Angle-Modulated Partitioned k-Space Spoiled Gradient Echo Snapshots (3D MAPSS)," *Magn Reson Med* 59 (2008): 298-307; and Zhao, L., R. Mulkern, C. H. Tseng, D. Williamson, S. Patz, R. Kraft, R. L. Walsworth, F. A. Jolesz, and M. S. Albert, "Gradient-Echo Imaging Considerations For Hyperpolarized $^{129}$Xe MR," *J Magn Reson B* 113 (1996): 179-183, which are incorporated by reference for all purposes. Although this strategy has been successfully used in applications such as hyperpolarized imaging, it reduces the overall signal levels to maintain the signal homogeneity. Furthermore, different flip angle trains might have to be designed for various imaging conditions, and such sequences can be more susceptible to $B_1$ inhomogeneities.

On the other hand, specialized post-processing methods have been employed to compensate for the transient signal decay ($T_2$ decay) in echo-planar and fast spin-echo sequences. However, because the reconstructions do not include a denoising step, the amplified noise can significantly deteriorate the image quality. Therefore, the use of such techniques is mostly limited to high-SNR imaging scenarios (e.g., precompensation SNR levels larger than approximately 30-40). As a remedy, various approaches have been proposed to dampen the amplified high-frequency noise by weighting the compensation filters with a low-pass window in k-space. While these strategies reduce the level of noise amplification and the image noise, they cannot achieve the ideal PSF and spatial resolution since they only perform partial decay compensation.

In contrast, embodiments of the invention may fully compensate the signal decay to achieve the prescribed nominal resolution, and reduce the resulting noise with CS reconstructions. Therefore, these embodiments allow more aggressive use of signal compensation compared to prior art, and thereby offer improved performance. Meanwhile, these embodiments do not require any modification of the scan parameters or the imaging sequence. The tissue/background contrast is improved without sacrificing scan efficiency. Finally, these embodiments offer enhanced applicability at higher field strengths along with improved robustness against RF field inhomogeneities compared to variable-flip-angle approaches.

There are several potential variations that can be used in various embodiments of the invention. First, variable-flip-angle trains and signal compensation can be combined to further extend the applicability of the technique in cases where the transient signal decays very rapidly. In such cases, the use of variable flip angles to partially improve the signal homogeneity can reduce the overall image noise, while the remaining decay can still be corrected with post-processing, as described in Busse, R. F., "Designing Variable Flip Angle Refocusing Trains to Optimize Resolution, Signal-to-Noise, and RF Power," *Proceedings of the* 13*th Annual Meeting of ISMRM*, Miami Beach, (2005): p. 2349, which is incorporated by reference for all purposes. Furthermore, the signal is compensated based on the parameters of a single tissue. More specialized pixel-wise compensation techniques have been previously proposed in Shenberg, I., and A. Macovski, "Resolution and Noise Considerations in MRI Systems with Time-Varying Gradients," *IEEE Trans Med Imaging* 4 (1985): 144-152; Oshio, K., and M. Singh, "A Computer Simulation of T2 Decay Effects in Echo Planar Imaging," *Magn Reson Med* 11 (1989): 389-397; Zhou, X., Z. P. Liang, G. P. Cofer, C. F. Beaulieu, S. A. Suddarth, and G. A. Johnson, "Reduction of Ringing and Blurring Artifacts in Fast Spin-Echo Imaging," *J Magn Reson Imaging* 3 (1993): 803-807, which are incorporated by reference for all purposes. In cases where the signal from heterogeneous samples needs to be compensated, these techniques can be simply incorporated into an embodiment of the invention for improved performance.

In embodiments where the data is not compressible in the image domain, the TV regularization term in CS reconstructions can be replaced with an appropriate sparsifying transform (e.g., wavelet transform). CS can also be replaced with a combination of parallel imaging, as described in Heidemann, R. M., O. Ozsarlak, P. M. Parizel, J. Michiels, B. Kiefer, V. Jellus, M. Muller, F. Breuer, M. Blaimer, M. A. Griswold, and P. M. Jakob, "A Brief Review of Parallel Magnetic Resonance Imaging," *Eur Radiol* 13 (2003): 2323-2337, and Pruessmann, K. P., "Encoding and Reconstruction in Parallel MRI," *NMR Biomed* 19 (2006): 288-299, which are incorporated by reference for all purposes; and specialized denoising techniques in Buades, A., B. Coll, and J. M. Morel, "A Review of Image Denoising Algorithms, with a New One," *Multisc Model Simulat* 4 (2005): 490-530, which is incorporated by reference for all purposes.

The amplification of high spatial frequencies can lead to edge enhancement in certain tissues, which experience a smaller signal change between the preparation and steady state compared to the tissue of interest. However, magnetization preparation already reduces the signal from background tissues. Furthermore, many background tissues have lower frequency content than the tissue of interest. As a result, no significant artifacts were observed despite the shorter $T_2$ of muscle or fat. When background tissues with considerable high frequency content are insufficiently suppressed, partial decay compensation can help prevent edge enhancement in an embodiment of the invention.

The idea of compensating the k-space data for the transient signal decay in magnetization-prepared angiograms is one novel feature of embodiments of the invention. While the resulting resolution improvement can be readily anticipated, the notion of enhancing the contrast through signal compensation when the background has lower spatial-frequency content than the tissue of interest is particularly novel. The use of compressed sensing reconstructions to recover the desired tissue signal from potentially sparse magnetization-prepared datasets is another novel aspect of various embodiments of the invention.

Embodiments of the invention facilitate the use of magnetization-prepared imaging in applications where the inherent steady-state contrast is not sufficient to clearly depict the tissues of interest. Magnetization-prepared acquisitions often require prolonged scan times and suffer from image blurring. Various embodiments enhance the image contrast and resolution through a simple weighting of the collected data, without sacrificing scan efficiency. Therefore, these embodiments improve the robustness and applicability of magnetization-prepared imaging, particularly when allowable scan times are limited (e.g., angiography, hyperpolarized imaging).

Figure 7:
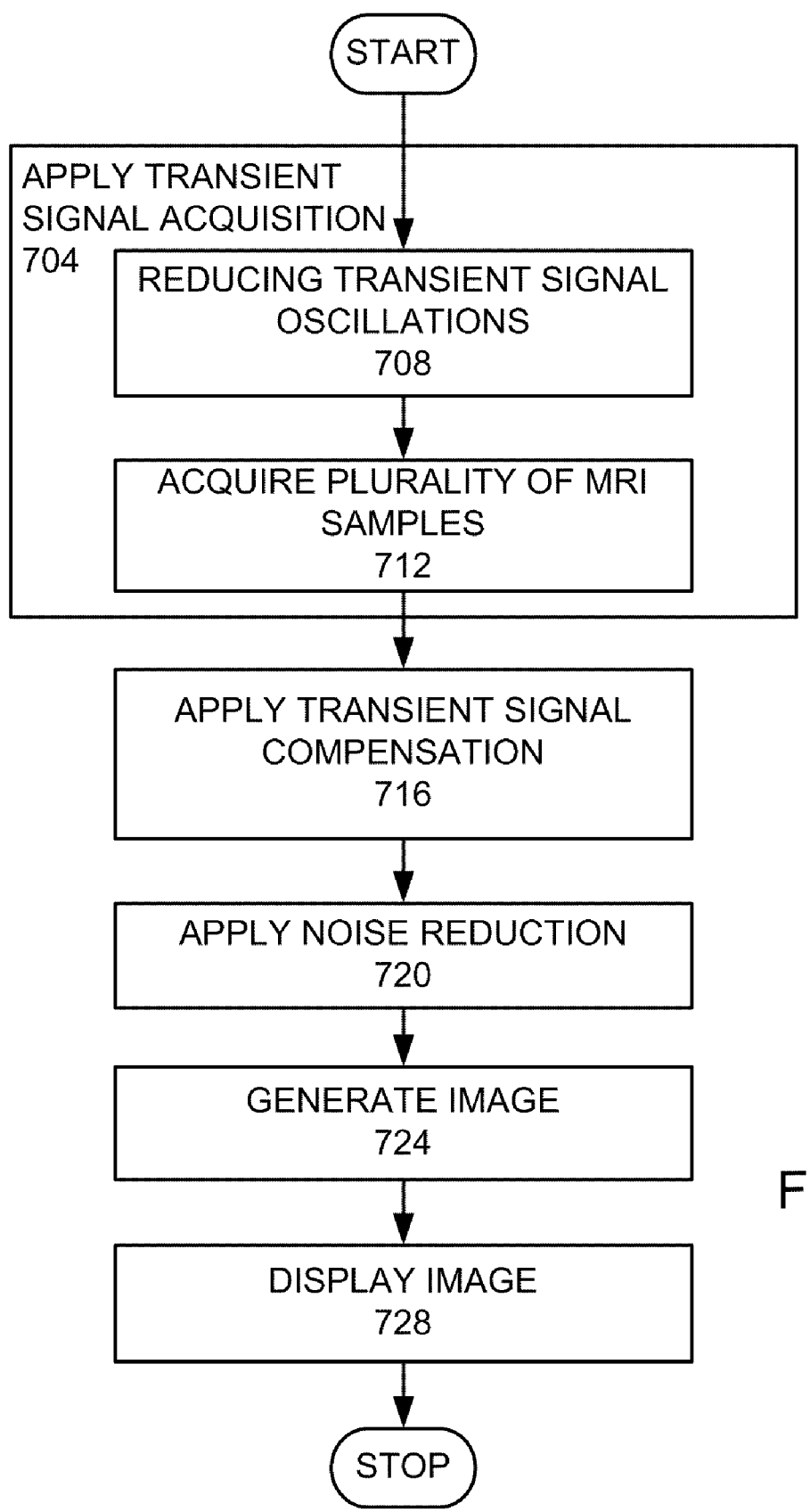
FIG. 7 is a flow chart of an embodiment of the invention.

FIG. 7 is a high level flow chart of an embodiment of the invention, such as the embodiment that uses the excitation and acquisition process shown in FIG. 2. For each k-space segment, a transient signal acquisition is applied (step 704). In the specification and claims transient signal acquisition is defined as acquiring an MRI signal that has not yet reached steady-state, but is still transient, i.e., during the evolution of the MRI signal to steady-state from a different initial state. If there is no difference between the initial state and the steady state or if acquisition only occurs during steady state, then the signal would be constant and there would be no decay to compensate for, making some of the subsequent steps ineffective. In an embodiment of the invention this is accomplished by performing a $T_2$-preparation at the beginning of each k-space segment. The application of the transient signal acquisition (step 704) comprises reducing the transient signal oscillations (step 708) and acquiring a plurality of MRI samples (step 712). Transient signal oscillations are reduced (step 708). In this embodiment of the invention, a ramping catalyzation is applied by a ramped series of RF excitations to dampen the transient signal oscillations. A plurality of MRI samples is acquired (step 712). In this embodiment, a plurality of samples of data is collected with an ATR SSFP host sequence. Because the prepared contrast gradually decays to the steady-state contrast, only a limited number of samples are collected after a single preparation. The magnetization is then allowed to recover during a period $T_{wait}$. This procedure is repeated until all segments are acquired.

Transient signal compensation is applied to the collected plurality of samples of data (step 716). In this embodiment, the transient signal compensation comprises applying decay compensation to the data. In this embodiment, if the transient signal decay curve proceeds from high-to-low, the decay compensation weights higher spatial frequencies more heavily than lower spatial frequencies. If the transient signal decay curve proceeds from low-to-high, then the higher spatial frequencies would be less heavily weighted. A noise reduction is applied (step 720). In this embodiment, a compressed sensing reconstruction is applied to the transient signal compensated data. The data resulting from the noise reduction is used to generate an image (step 724). In this embodiment, the noise reduction is accomplished by applying compressed sensing. The compressed sensing may be an iterative optimization algorithm as described above. The generated image is displayed (step 728). In this embodiment, the image may be displayed on a display 904 or be displayed as a printed image.

Figure 8:
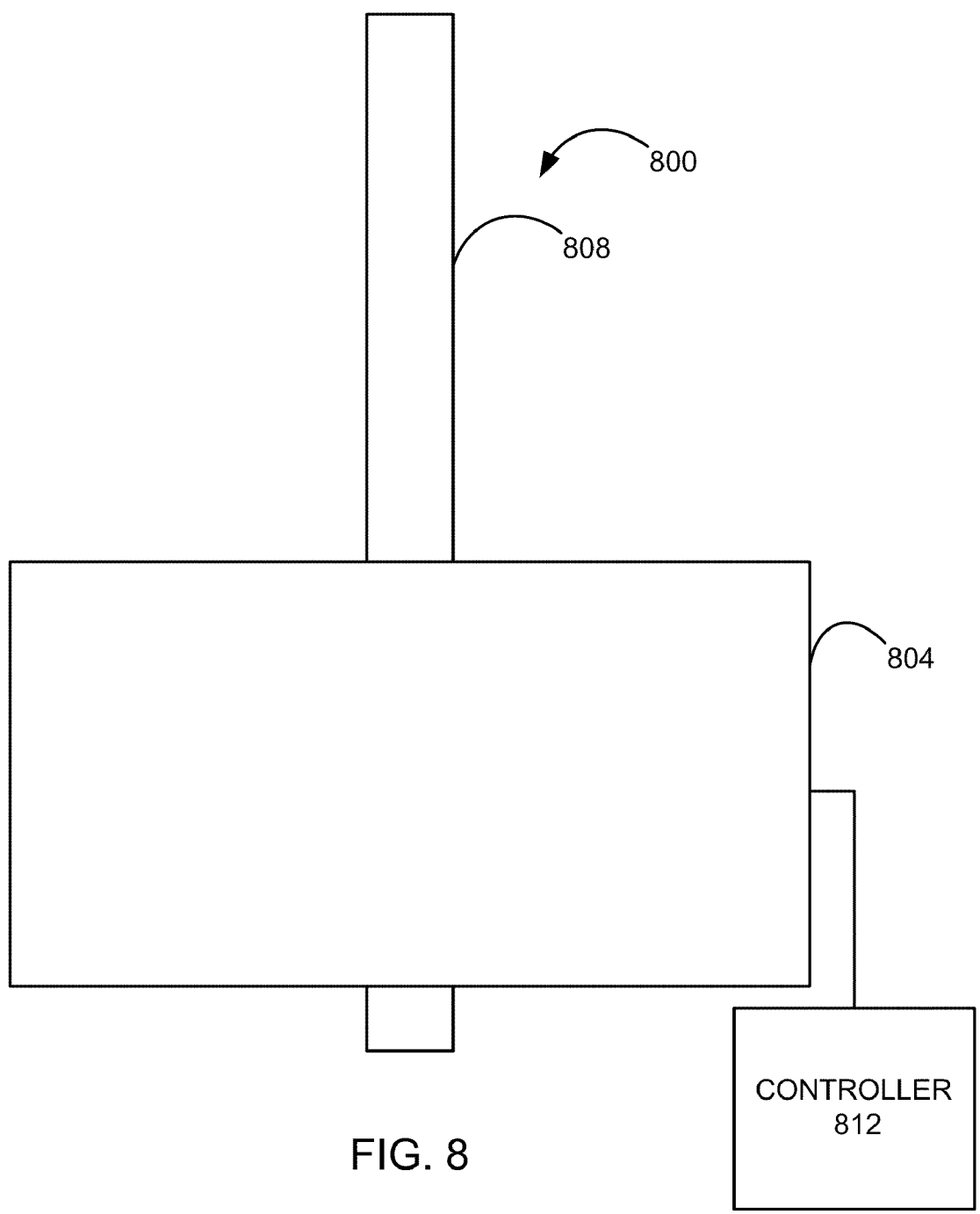
FIG. 8 is a schematic top view of a magnetic resonance imaging (MRI) system that may be used in an embodiment of the invention.

FIG. 8 is a schematic top view of a magnetic resonance imaging (MRI) system 800 that may be used in an embodiment of the invention. The MRI system 800 comprises a magnet system 804, a patient transport table 808 connected to the magnet system, and a controller 812 controllably connected to the magnet system. In one example, a patient would lie on the patient transport table 808 and the magnet system 804 would pass around the patient. The controller 812 would control magnetic fields and radio frequency (RF) signals provided by the magnet system 804 and would receive signals from detectors in the magnet system 804.

Figure 9A:
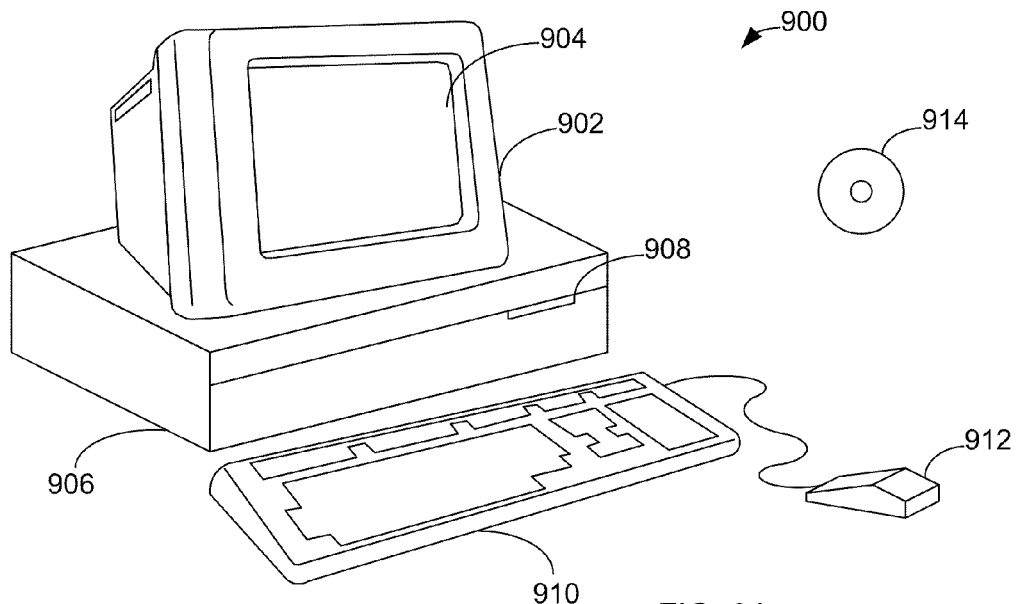

FIG.'s 9A and 9B illustrate a computer system 900, which is suitable for implementing a controller 812 used in embodiments of the present invention. FIG. 9A shows one possible physical form of the computer system. Of course, the computer system may have many physical forms ranging from an integrated circuit, a printed circuit board, and a small handheld device up to a huge super computer. Computer system 900 includes a monitor 902, a display 904, a housing 906, a disk drive 908, a keyboard 910, and a mouse 912. Disk 914 is a computer-readable medium used to transfer data to and from computer system 900.

Figure 9B:
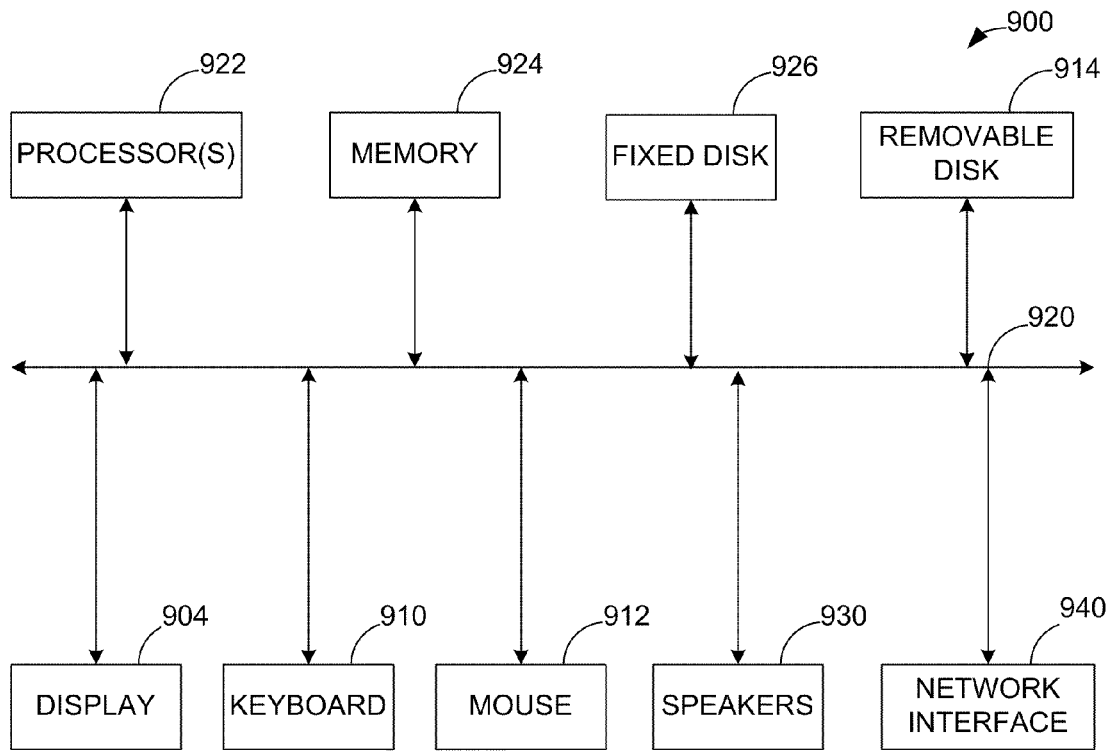

FIG. 9B is an example of a block diagram for computer system 900. Attached to system bus 920 are a wide variety of subsystems. Processor(s) 922 (also referred to as central processing units, or CPUs) are coupled to storage devices, including memory 924. Memory 924 includes random access memory (RAM) and read-only memory (ROM). As is well known in the art, ROM acts to transfer data and instructions uni-directionally to the CPU and RAM is used typically to transfer data and instructions in a bi-directional manner. Both of these types of memories may include any suitable of the computer-readable media described below. A fixed disk 926 is also coupled bi-directionally to CPU 922; it provides additional data storage capacity and may also include any of the computer-readable media described below. Fixed disk 926 may be used to store programs, data, and the like and is typically a secondary storage medium (such as a hard disk) that is slower than primary storage. It will be appreciated that the information retained within fixed disk 926 may, in appropriate cases, be incorporated in standard fashion as virtual memory in memory 924. Removable disk 914 may take the form of the computer-readable media described below.

CPU 922 is also coupled to a variety of input/output devices, such as display 904, keyboard 910, mouse 912, and speakers 930. In general, an input/output device may be any of: video displays, track balls, mice, keyboards, microphones, touch-sensitive displays, transducer card readers, magnetic or paper tape readers, tablets, styluses, voice or handwriting recognizers, biometrics readers, or other computers. CPU 922 optionally may be coupled to another computer or telecommunications network using network interface 940. With such a network interface, it is contemplated that the CPU might receive information from the network, or might output information to the network in the course of performing the above-described method steps. Furthermore, method embodiments of the present invention may execute solely upon CPU 922 or may execute over a network such as the Internet in conjunction with a remote CPU that shares a portion of the processing.

In addition, embodiments of the present invention further relate to computer storage products with a computer-readable medium that has computer code thereon for performing various computer-implemented operations. The media and computer code may be those specially designed and constructed for the purposes of the present invention, or they may be of the kind well known and available to those having skill in the computer software arts. Examples of computer-readable media include, but are not limited to: magnetic media such as hard disks, floppy disks, and magnetic tape; optical media such as CD-ROMs and holographic devices; magneto-optical media such as floptical disks; and hardware devices that are specially configured to store and execute program code, such as application-specific integrated circuits (ASICs), programmable logic devices (PLDs) and ROM and RAM devices. Examples of computer code include machine code, such as produced by a compiler, and files containing higher level code that are executed by a computer using an interpreter. Computer readable media may also be computer code transmitted by a computer data signal embodied in a carrier wave and representing a sequence of instructions that are executable by a processor.

While this invention has been described in terms of several preferred embodiments, there are alterations, permutations, modifications and various substitute equivalents, which fall within the scope of this invention. It should also be noted that there are many alternative ways of implementing the methods and apparatuses of the present invention. It is therefore intended that the following appended claims be interpreted as including all such alterations, permutations, modifications, and various substitute equivalents as fall within the true spirit and scope of the present invention.

What is claimed is:

1. A method for enhancing resolution and contrast in an MRI image for execution on a magnetic resonance image (MRI) system comprising a magnet system and a controller for controlling the magnet system, comprising:

applying a transient signal acquisition by the controller through the magnet system to acquire a plurality of samples of data, comprising;

reducing transient signal oscillations; and
acquiring a plurality of MRI samples of data;
applying by the controller transient signal compensation to the plurality of samples of data to provide data with signal compensation;
applying by the controller a noise reduction technique to the data with signal compensation; and
using data resulting from the applying the noise reduction to generate through the controller an MRI image.

2. The method, as recited in claim 1, wherein the applying a transient signal acquisition comprises applying a $T_2$ preparation.

3. The method, as recited in claim 2, wherein the reducing transient signal oscillations comprises applying ramp catalyzation.

4. The method, as recited in claim 3, wherein the acquiring a plurality of MRI samples of data comprises performing alternating repetition time (ATR) steady-state free procession (SSFP) acquisition to acquire a plurality of samples of data.

5. The method, as recited in claim 4, wherein the applying the noise reduction technique to the data comprises applying compressed sensing to the data with signal compensation.

6. The method, as recited in claim 5, wherein the applying compressed sensing to data comprises applying an iterative optimization algorithm to the data.

7. The method, as recited in claim 6, wherein the applying transient signal compensation comprises applying decay compensation to the plurality of samples of data.

8. The method, as recited in claim 7, wherein a transient signal decay curve proceeds from high-to-low and the decay compensation weights higher spatial frequencies more heavily than lower spatial frequencies.

9. The method, as recited in claim 7, wherein a transient signal decay curve proceeds from low-to-high and the decay compensation weights higher spatial frequencies less heavily than lower spatial frequencies.

10. The method, as recited in claim 8, wherein the decay compensation increases a contrast between a first species and a second species.

11. The method, as recited in claim 10, wherein the MRI image is an angiographic image.

12. The method, as recited in claim 10, wherein the performing the ATR SSFP acquisition comprises providing at least two consecutive repetition times of different durations and with phase cycling to create a stop-band to suppress a third background species.

13. The method, as recited in claim 12, wherein the applying the $T_2$ preparation further comprises generating a BIR-4 pulse.

14. The method, as recited in claim 13, wherein the iterative optimization algorithm solves the optimization problem minimize $\|m\|_1 + \lambda TV(m)$ s.t. $\|F_u m - y\|_2 \leq \epsilon$.

15. The method, as recited in claim 1, wherein the reducing transient signal oscillations comprises applying ramp catalyzation.

16. The method, as recited in claim 1, wherein the acquiring a plurality of MRI samples of data comprises performing alternating repetition time (ATR) steady-state free procession (SSFP) acquisition to acquire a plurality of samples of data.

17. The method, as recited in claim 1, wherein the applying the noise reduction technique to the data comprises applying compressed sensing to the data with signal compensation.

18. A method for enhancing resolution and contrast in an MRI image for execution on a magnetic resonance imaging (MRI) system comprising a magnet system and a controller for controlling the magnet system, comprising:
applying a transient signal acquisition by the controller through the magnet system to acquire a plurality of samples of data, comprising;
applying $T_2$ preparation;
applying ramp catalyzation; and
performing alternating repetition time (ATR) steady-state free procession (SSFP) acquisition to acquire a plurality of samples of data;
applying by the controller decay compensation to the plurality of samples of data to provide data with signal compensation;
applying by the controller an iterative optimization algorithm to data with decay compensation; and
using data resulting from the iterative optimization algorithm to generate through the controller an MRI image.

19. An apparatus for providing magnetic resonance imaging, comprising:
a magnetic resonance imaging excitation and detection system; and
a controller electrically connected to the magnetic resonance imaging excitation and detection system, comprising:
a display;
at least one processor; and
non-transitory computer readable media, comprising:
computer readable code for applying a transient signal acquisition to acquire a plurality of samples of data; comprising
computer readable code for reducing transient signal oscillations; and
computer readable code for acquiring a plurality of MRI samples of data;
computer readable code for applying transient signal compensation to the plurality of samples of data to provide data with signal compensation;
computer readable code for applying a noise reduction technique to the data with signal compensation;
computer readable code using data resulting from the compressed sensing to generate an MRI image; and
computer readable code for displaying the MRI image.

* * * * *